United States Patent [19]

Gregory et al.

[11] Patent Number: 5,233,351
[45] Date of Patent: Aug. 3, 1993

[54] LOCAL OSCILLATOR ARRANGEMENT FOR A MONOPULSE RECEIVER IN A SEMIACTIVE MISSILE GUIDANCE SYSTEM

[75] Inventors: Nicholas Gregory, Andover; William M. Murphy, Wellesley, both of Mass.

[73] Assignee: Raytheon Company, Lexington, Mass.

[21] Appl. No.: 607,989

[22] Filed: Aug. 26, 1975

[51] Int. Cl.⁵ .......................... G01S 13/00; H03B 1/00
[52] U.S. Cl. .................................. 342/100; 342/102; 331/76
[58] Field of Search ............. 331/76; 343/5 AF, 7 A; 342/100, 102

[56] References Cited

U.S. PATENT DOCUMENTS

| | | | |
|---|---|---|---|
| 2,831,974 | 4/1958 | Wright et al. | 343/5 AF |
| 3,064,199 | 11/1962 | Brabham | 331/76 |
| 3,417,396 | 12/1968 | Stifter et al. | 343/5 AF |
| 3,569,965 | 3/1971 | Bagley | 343/5 AF |
| 3,789,302 | 1/1974 | Rearwin et al. | 331/76 |
| 3,824,475 | 7/1974 | Pflasterer | 331/76 |
| 3,885,238 | 5/1975 | Klein et al. | 343/7 A |

*Primary Examiner*—Nelson Moskowitz
*Attorney, Agent, or Firm*—Donald F. Mofford; Richard M. Sharkansky

[57] ABSTRACT

An improved local oscillator arrangement for a monopulse receiver in a semiactive missile guidance system is shown. The monopulse receiver includes an improved reference local oscillator wherein a first local oscillator signal and a pair of reference signals required to demodulate the output of the intermediate frequency section of such receiver are derived simultaneously from the output of a single voltage controlled crystal oscillator. The frequencies of the first local oscillator and the pair of reference signals are related to the frequency of the radar modified by any Doppler shift frequency experienced during an intercept.

4 Claims, 4 Drawing Sheets

LOCAL OSCILLATOR ARRANGEMENT FOR A MONOPULSE RECEIVER IN A SEMIACTIVE MISSILE GUIDANCE SYSTEM

BACKGROUND OF THE INVENTION

This invention pertains generally to guidance systems for missiles and particularly to systems of such character which utilize radar signals to derive command signals for guiding missiles during flight.

It is known in the art that a so-called "semiactive" radar guidance system may be used to derive the requisite guidance signals for a missile in flight toward a target. In a typical system of such a type, radar echo signals from a target being tracked by an illuminator (which may be either an airborne or a ground radar) and radar signals from the illuminator are received in the missile and demodulated. The demodulated signals then are processed to provide the requisite guidance signals during flight of the missile. Additionally, the radar echo signals may also be utilized to determine when ordnance carried by the missile should be armed and detonated to realize the highest probability of lethal damage to the target.

In order that the receiving arrangement in the missile may be operated satisfactorily in the presence of noise or interfering signals, it is common practice to provide a so-called "inverse" receiver for the amplification of the radar echo signals from a target. Briefly, an inverse receiver is a receiver having an intermediate frequency (I.F.) amplifier section with an extremely narrow pass band. Such section is fed by a beat frequency signal obtained by mixing the radar echo signals with the output of a local oscillator carried on the missile. Obviously, such an amplifier may be operated to good effect only when the frequency of the radar echo signals is known and the frequency of the output of local oscillator is adjustable to an offset frequency equal to the beat frequency to which the amplifier may respond.

It is relatively difficult to provide, using components which may be subject to instability in frequency and susceptible to frequency modulated (FM) noise, a satisfactory inverse receiver for use in a missile controlled by a semiactive radar guidance system. One accepted way for solving the technical problems involved is to provide, in addition to an inverse receiver for radar echo signals, a so-called "rear" receiver. Such a receiver includes an antenna oriented rearwardly of the missile and illuminated during flight by the airborne or ground radar (whence comes the designation "rear" receiver) and means for continuously controlling, by an automatic frequency control arrangement, the frequency of the local oscillator in the missile in accordance with the frequency of signals received from such radar. Additionally, the automatic frequency control arrangement is used to change the frequency of the output of the local oscillator, thereby compensating for any change in frequency of the radar echo signals due to any Doppler velocity between the missile and target to maintain the frequency of the beat frequency signal within the pass band of the I.F. amplifier.

While adequate performance of a semiactive radar guidance system using a rear receiver has been achieved in many instances, there are several reasons for improving the way in which the control of the frequency of the output of the local oscillator in a missile using such a guidance system is effected. First of all, if the complexity added by the rear receiver may be reduced, a concomitant decrease in cost may be achieved. Further, a reduced complexity of the rear receiver may increase the reliability of the system. Most importantly, perhaps, is the fact that if the frequency of the local oscillator in the missile may be controlled without requiring continuous illumination by the airborne or ground radar during flight, constraints on the intercept course of the missile may be relaxed significantly. That is to say, if continuous illumination is not necessary to control the frequency of the local oscillator in the missile, a semiactive guidance technique may be used with a single radar tracking a target, even though the intercept course of the missile is not within the beam (or any sidelobe) of such radar.

It is well known to use monopulse techniques in a receiver in a missile to derive angle errors in yaw and pitch with a high degree of precision. According to known monopulse techniques, radio frequency signals received as echo signals from a target are first processed to obtain a sum signal, a yaw error signal, $y_e$, and a pitch error signal, $p_e$. After downconversion of such processed signals and amplification in three different channels, the signals are multiplexed, normalized, demultiplexed and detected. While such an approach is satisfactory in operation, relatively complex circuitry is required. It would, obviously, then be advantageous to accomplish the same end as a conventional monopulse receiver with relatively simple circuitry.

An altogether different problem is encountered, especially when the illuminator is an airborne radar, with conventional semiactive radar guidance systems for missiles. If there are aircraft in formation, each one carrying a radar to control missiles, a high probability exists that mutual interference may be experienced. For example, if during the initial portion of the flight of a missile, the relative positions of the mother aircraft (meaning the aircraft from which the missile was launched) and the missile are such that radar signals from the mother aircraft enter through a sidelobe of the antenna pattern of the rear receiver and the relative positions of a sister aircraft (meaning another aircraft in the formation) and the missile are such that radar signals from the sister aircraft enter through the main lobe of the antenna pattern of the rear receiver, the local oscillator in the missile may be caused to "lock" on the radar signals from the sister aircraft. Obviously, then, the radar in the mother aircraft is ineffective to provide the radar echo signals required to derive guidance signals for the missile.

SUMMARY OF THE INVENTION

Therefore, it is a primary object of this invention to provide an improved local oscillator for a monopulse receiver used in a semiactive missile guidance system.

The foregoing and other objects of this invention are attained generally by providing, in a monopulse receiver in a missile controlled by a semiactive radar guidance system, an improved local oscillator arrangement wherein the local oscillator frequency (which frequency here is in X-band) applied to the first detector of the monopulse receiver is derived from a voltage controlled crystal oscillator operating at relatively low frequency (here 5 MHz). The requisite frequency transformation is attained by passing the output of the voltage controlled crystal oscillator through a plurality of frequency multipliers, each one containing a narrow band filter so that a single spectrally pure high frequency signal is produced and then modulating such signal with the output of the voltage controlled crystal oscillator to produce a comb of signals, any one of which serves partially to determine the frequency of a voltage controlled oscillator. The frequency of the just-mentioned oscillator is also controlled by a programmed frequency select signal which, in effect, changes the particular one of the comb signals until a target or a feedthrough signal is detected.

BRIEF DESCRIPTION OF THE DRAWINGS

For a more complete understanding of this invention reference is now made to the following description of the accompanying drawings wherein.

DESCRIPTION OF THE PREFERRED EMBODIMENT

Figures 1, 4:
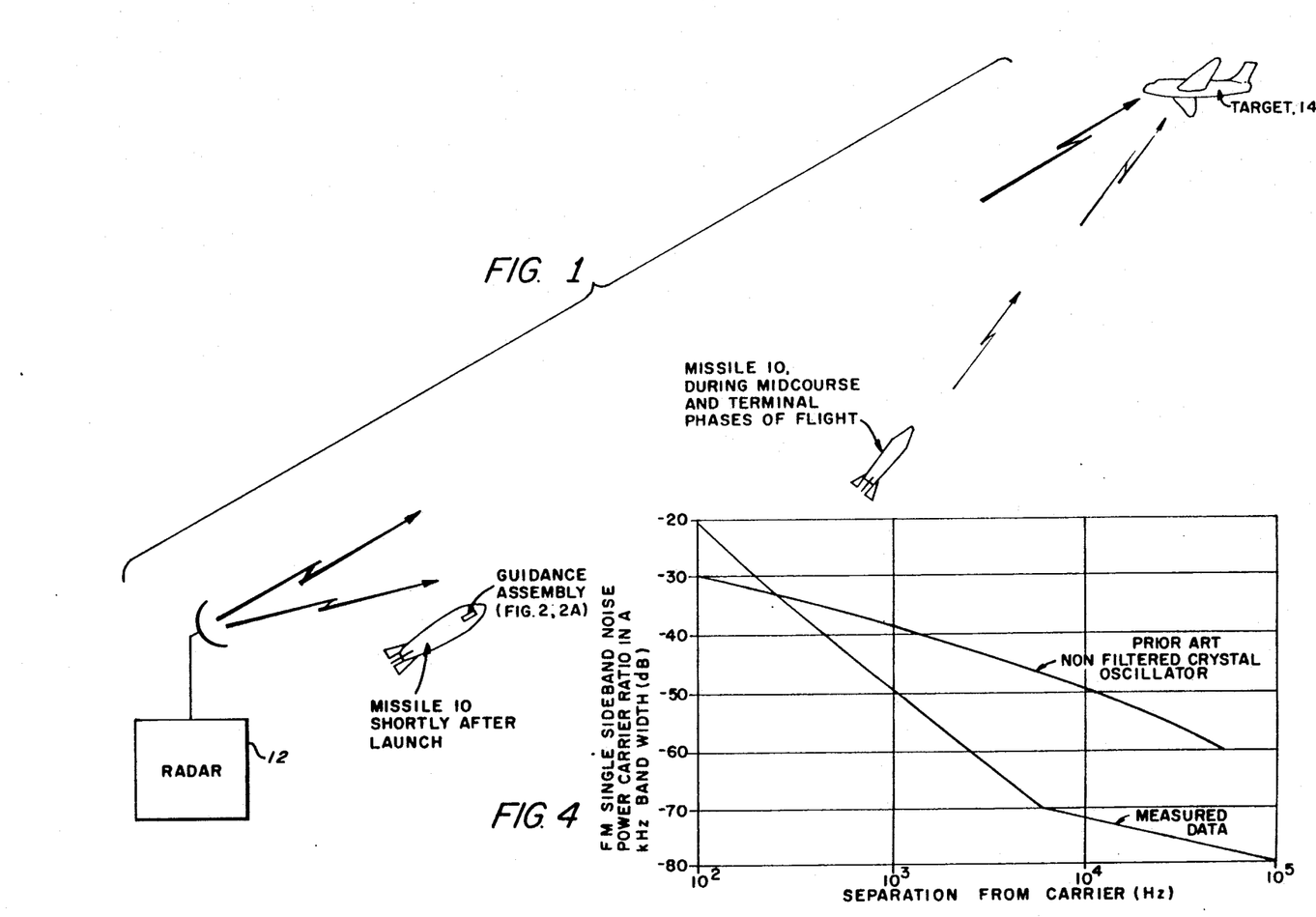
FIG. 1 is a sketch illustrating the manner in which an intercept would be carried out according to this invention.
FIG. 4 is a graph illustrating the advantages of the arrangement shown in FIG. 2 over known arrangements intended for the same purpose.

Referring now to FIG. 1, it may be seen that, if the launching site of a missile 10 is assumed to be near a radar 12 (here a CW radar) which is tracking a target 14, radar signals from the radar 12, at launch and for a short time thereafter, will also be received by the missile 10. That is to say, for at least a short period of time (say in the order of 1 second) after the missile 10 is launched, the level of "feedthrough" signals (meaning signals transmitted directly from the radar 12 to the missile 10 and received in a sidelobe of the antenna pattern of the antenna in the missile 10) will be far higher than the level of echo signals from the target 14 received in the missile 10 through the main lobe of such pattern. As the missile 10 moves away from the radar 12 towards the target 14, the level of the feedthrough signals decreases at a more rapid rate than the rate at which the echo signals from the target 14 increases. This is so because, as the range between the missile 10 and the radar 12 increases, the aspect angle of the latter (as observed from the former) changes so that radar signals are received in sidelobes of the antenna pattern of the antenna in the missile 10 rather than main lobe of such pattern. To capitulate: (a) at launch and shortly thereafter (as indicated in FIG. 1) when the missile 10 is in the position labeled "missile 10 shortly after launch" the level of the feedthrough signals is so high as to mask echo signals; and (b) during the remainder of the flight of the missile 10 (as indicated in FIG. 1 when the missile 10 is in the position labeled "missile 10 during midcourse and terminal stages of flight"), the level of echo signals from the target 14 is far higher than the level of feedthrough signals.

The fact that the level of feedthrough signals is high enough to mask echo signals during the initial stages of flight is here used to advantage. Thus, in a manner to be described in detail hereinafter, the feedthrough signals are processed to derive a first control signal to set the frequency of the local oscillator in an inverse receiver in the missile 10 to a desired offset frequency with respect to the frequency of the radar 12. Then, when the distance between the missile 10 and the radar 12 is great enough to make feedthrough signals ineffective, a second control signal is derived from echo signals from the target 14 to change the offset frequency of the local oscillator to provide for any Doppler shift due to the relative motion between the missile 10 and the target 14.

Figure 2:
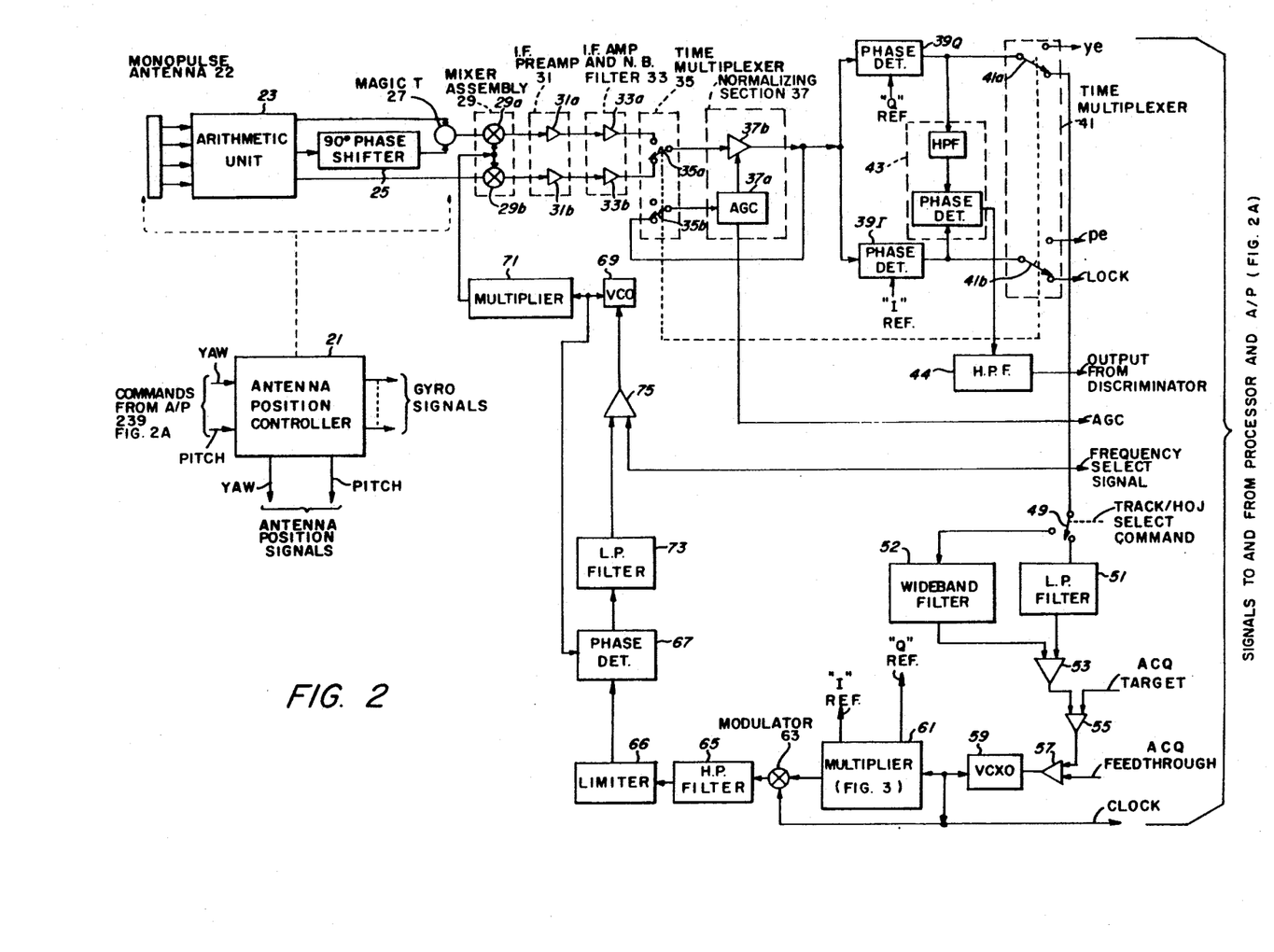
FIGS. 2 and 2A taken together constitute a block diagram of a monopulse receiver and a signal processor according to this invention.
Figure 2A:
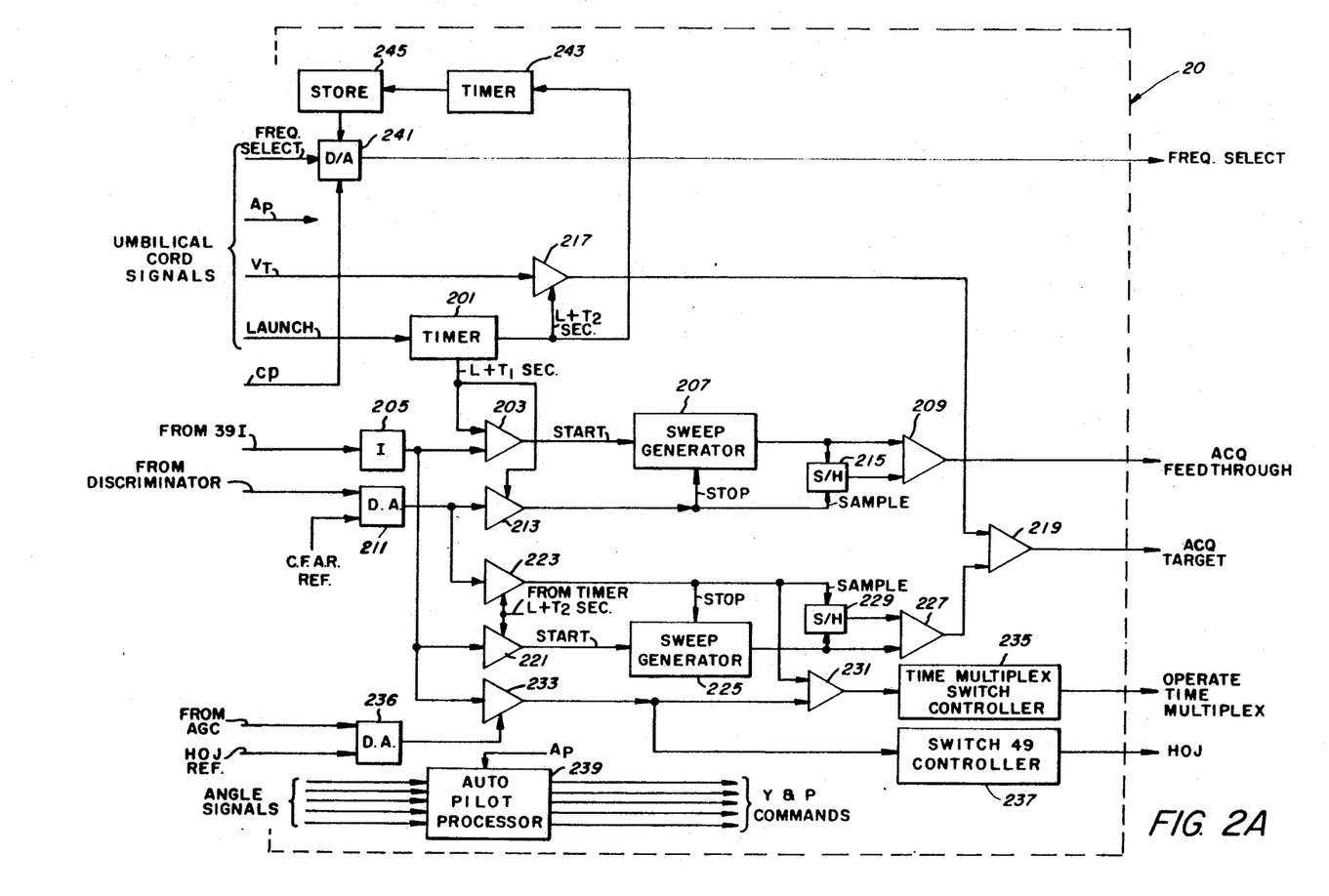

Referring now to FIG. 2 it may be seen that the guidance assembly (unnumbered) in a missile 10 according to this invention comprises a receiver (unnumbered, but to be described) and a processor and autopilot section (shown in FIG. 2A). Suffice it to say here that the latter section comprises logical circuitry, responsive to pre-launch signals from the radar 12 (FIG. 1), angle error signals and condition signals from the receiver and to pitch, yaw and gyroscope signals from an antenna position controller 21 to provide command signals to control the orientation of a monopulse antenna 22 and control surfaces (not shown) on the missile 10 (FIG. 1).

The radio frequency portion of the receiver comprises the antenna (here the monopulse antenna 22), an arithmetic unit 23, a 90° phase shifter 25 and a hybrid junction (here a "magic tee" 27). All of the elements just mentioned, along with appropriate gyroscopes, position sensors and motors (not shown) are mounted on a gimbal system (indicated by the dashed lines in the FIGURE) having two degrees of freedom. That is to say, the radio frequency portion of the receiver and the elements required to orient the monopulse antenna 22 along the line of sight between the missile 10 and the target 14 are mounted so as to be rotatable about the pitch and yaw axes of the missile 10 in accordance with the pitch and yaw command signals into the antenna position controller 21. As is conventional then, the boresight line of the monopulse antenna 22 may be aligned with the line of sight between the missile 10 and the target 14 during flight to derive signals required for guiding the missile 10 toward the target 14.

The arithmetic unit 23 here is a conventional arrangement of hybrid junctions to produce a monopulse sum signal and a pair of monopulse difference signals. As is known, if the monopulse sum signal out of the arithmetic unit 23 is taken as a reference, each one of the pair of monopulse difference signals, i.e. the pitch difference and the yaw difference signals (sometimes referred to hereinafter for convenience as the $p_e$ and the $y_e$ signals, respectively) are at 90° to the monopulse sum signal out of the arithmetic unit 23. The 90° phase shifter 25 causes the phase of one of the monopulse difference signals (here the $p_e$ signal) to be changed by 90° with respect to the other and also with respect to the monopulse sum signal. Therefore, when the $p_e$ (shifted) and the $y_e$ signals are applied to the magic tee 27, the output of that element is the vector sum of the $p_e$ (shifted) and the $y_e$ signals. Such vector sum signal will sometimes be referred to hereinafter as the angle error signal.

The monopulse sum signal and the angle error signal are fed as shown to a mixer assembly 29. The just-mentioned assembly comprises a pair of balanced mixers 29a, 29b. The local oscillator signal (generated in a manner to be described) is applied as shown to each one of the pair of balanced mixers 29a, 29b along with the monopulse sum signal and the angle error signal. The resulting I.F. signals are fed through an I.F. preamplifier (I.F. preamplifier 31) and an I.F. amplifier and narrow band filter (I.F. amplifier and narrow band filter 33). I.F. preamplifier 31 consists of two amplifiers having a pass band centered on the I.F. frequency (here 10 MHz) and a width sufficiently narrow to reject image frequency signals out of the mixer assembly 29. I.F. amplifier and narrow band filter 33 consists of two amplifiers, 33a, 33b, each having a pass band centered on the I.F. frequency and a pass band of, say, 2000 Hz. Such a narrow pass band preferably is attained in any convenient manner by incorporating a separate conventional crystal filter in the amplifying circuitry in each channel.

Before proceeding further, it will be observed that it has been elected here to accomplish normalization of the monopulse signals out of the I.F. amplifier and narrow band filter 33 and subsequent demodulation of such normalized signals by using a time multiplexing and demultiplexing technique. In connection with this, it has been chosen to illustrate the requisite switch arrangement in a schematic fashion by single-pole double-throw switches. Further, the illustrated position of each one of the switches in the time multiplexing and demultiplexing arrangement is the position taken by such switches when the monopulse sum signal is being processed.

With the foregoing in mind, it may be seen that a time multiplexer 35 comprises a pair of switches 35a, 35b. Switch 35a is connected as shown to feed the monopulse sum signal to a normalizing section 37. Switch 35b is connected as shown to enable an AGC detector and amplifier 37a in a normalizing section 37 to be actuated in response to the level of the monopulse sum signal after passing through an amplifier 37b. The control circuitry for the switches 35a, 35b will be described hereinafter; suffice it to say here that the switches 35a, 35b remain in their illustrated positions until tracking (on either the target 14, FIG. 1, or a jammer (not shown)) is initiated.

The output of the normalizing section 37 is fed to a pair of phase sensitive demodulators (here phase detectors 39I, 39Q) to which reference signals labeled "I" and "Q" respectively are also fed. The "I" reference signal, for reasons to be explained, is a sinusoidal signal at the I.F. frequency of any feedthrough or echo signal out of the normalizing section 37 and the "Q" reference signal is at the same frequency as the "I" reference signal, but displaced 90° in phase. That is to say, the "Q" reference signal is a cosinusoidal signal at the I.F. frequency of any feedthrough or echo signal out of the normalizing section 37.

It will be recognized now that any feedthrough or echo signal applied to the phase detectors 39I, 39Q (either type of such signals being a sinusoidal signal at an I.F. frequency within the pass band of the I.F. amplifier and narrow band filter 33) will be demodulated in the phase detectors 39I, 39Q when the "I" and "Q" reference frequencies are the same as the frequency of such feedthrough or echo signal. The requisite correspondence in the frequencies of the signals into the phase detectors 39I, 39Q is attained by a so-called "phase lock loop" presently to be described in connection with the description of the local oscillator control circuitry. Suffice it to say now that such phase lock loop is operative to force correspondence in the frequencies of the inputs to the phase detectors 39I, 39Q; under such condition then the output of the phase detector 39I is a maximum and the output of the phase detector 39Q is a minimum. Further, if the relative phases of the inputs to the phase detector 39Q change, the magnitude and the polarity of the output of the phase detector 39Q will be indicative of such relative change. The output of the phase detector 39Q may therefore be used as a control signal to change the phase lock loop ultimately to maintain the requisite correspondence in frequency between the input signals to the phase detectors 39I, 39Q. Similarly, the output of the phase detector 39I may be used to provide a "phase lock" indication when a feedthrough or an echo signal is being received. As is known, the presence or absence of such a phase lock or, more briefly, a "lock" signal is a convenient logical signal indicating whether or not target echo signals are being received; in the embodiment of this invention now being described the presence or absence of a lock signal may be used to indicate that a feedthrough signal is being received.

The outputs of the phase detectors 39I, 39Q are connected to a time demultiplexer 41 and to a discriminator arrangement 43 (to be described hereinafter). The time demultiplexer 41 includes a pair of switches 41a, 41b, each of which is actuated in synchronism with a corresponding one of the switches 35a, 35b in the time multiplexer 35. Thus, in the condition being described, the output of the phase detector 39I is connected to the processor and autopilot section 20.

The signal passed through the switch 41a, i.e. the output of the phase detector 39Q, is passed to a switch 49. The latter is, except when wide band jamming signals are being received, in the position shown in FIG. 2. Thus, the output of the phase detector 39Q is passed, through a low pass filter 51 (which here acts as an integrator to provide proper loop shaping) and summing amplifiers 53, 55, 57, to a voltage controlled crystal oscillator (VCXO 59). Under the condition now being discussed, the output of the summing amplifier 53 is analogous to the phase error between any signal out of the normalizing section and the "Q" reference signal; the output of the summing amplifier 55 is analogous to the sum of the output of the summing amplifier 53 and a sweep voltage (repetitively generated, when an echo signal is to be received, by a conventional sweep generator when the level of the signal out of the phase detector 39I indicates "LOCK NOT" and there is no jamming signal being received); and the output of the summing amplifier 57 is analogous to the sum of the output of the summing amplifier 57 and a sweep voltage (repetitively generated, when a feedthrough signal is to be received, by a conventional sweep generator until such a signal is received during the initial stage of flight of the missile 10).

The output of the VCXO 59 is fed to a multiplier 61 and to a modulator, referred to as mixer 63. The former element (to be described in more detail in connection with FIG. 3) here operates to produce the I and Q reference signals and to upconvert the output of the VCXO 59 to a radio frequency signal, say an L-band signal. The mixer 63 produces a plurality of beat signals between the signals into such element. Thus, if the nominal frequency of the VCXO 59 is 5 MHz and the total multiplication factor of the multiplier 61 is 200, then the beat frequencies are $[(200 \cdot 5) \pm n(5)]$ MHz, where "n" is an integral positive number. The plurality of beat signals out of the mixer 63 will be referred to as a comb of frequencies. Obviously, when the frequency of the VCXO 59 is changed, the frequencies of the comb of frequencies change (the carrier changing by the factor 200 and the frequencies of the various sidebands changing by the factor "n").

The output of the mixer 63 is fed, through a high pass filter 65 and a limiter 66, to a phase detector 67. The second input to the phase detector 67 is the output of a voltage controlled oscillator (VCO 69) which here produces a signal at a nominal frequency of 1000 MHz. Such signal is fed to a multiplier 71 as well as the phase detector 67. The output of the phase detector 67 is connected, through a low pass filter 73 and a summing amplifier 75, to the VCO 69. The second input to the summing amplifier 75 is a D.C. signal whose amplitude is determined before launch to correspond with the frequency transmitted by the radar 12 (FIG. 1). It will be appreciated, therefore, that the circuitry now being described constitutes a conventional "phase-locked" voltage controlled oscillator circuit where the frequency of the oscillator may be forced to coincide with any selected one of the combination of frequencies making up the signals out of the high pass filter 65. Additionally, with the multiplier 71 having a multiplication factor required to upconvert the output of the VCO 69 from L-band to the band selected for the radar 12 (FIG. 1), it will be appreciated that the frequency of the signal out of the multiplier 71 is, before launch of the missile 10 (FIG. 1), at most in error by an amount VCXO 59 multiplied by the multiplication factors of the multipliers 61, 71.

Figure 3:
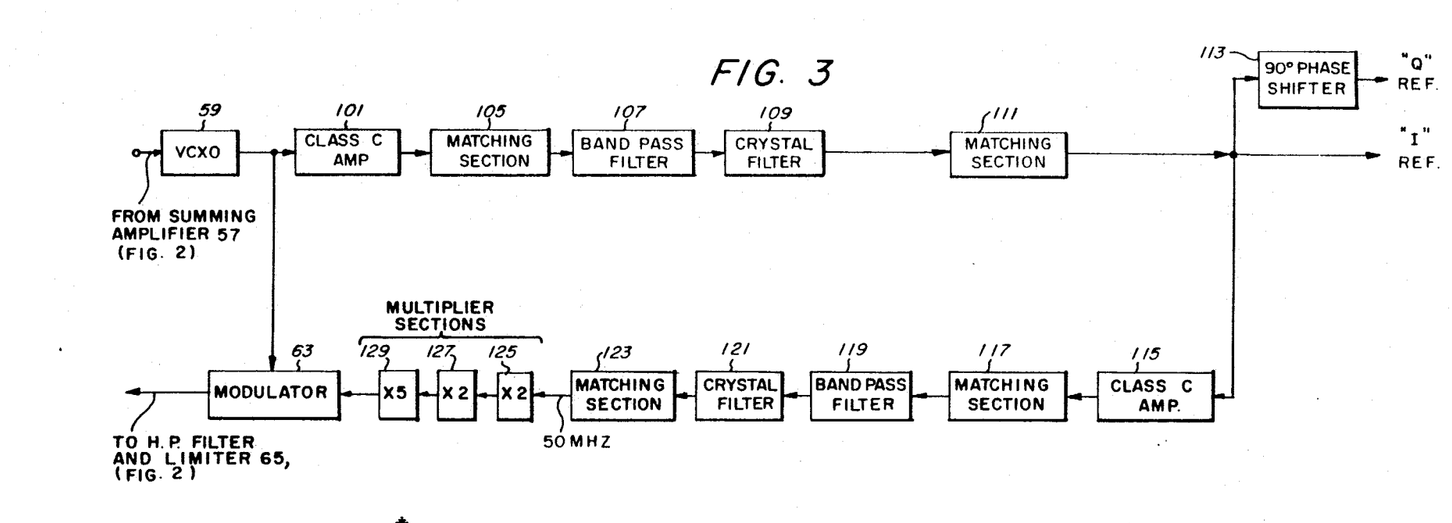
FIG. 3 is a block diagram of a frequency multiplier used in changing the frequency of a voltage controlled crystal oscillator according to this invention.
Figure 3A:
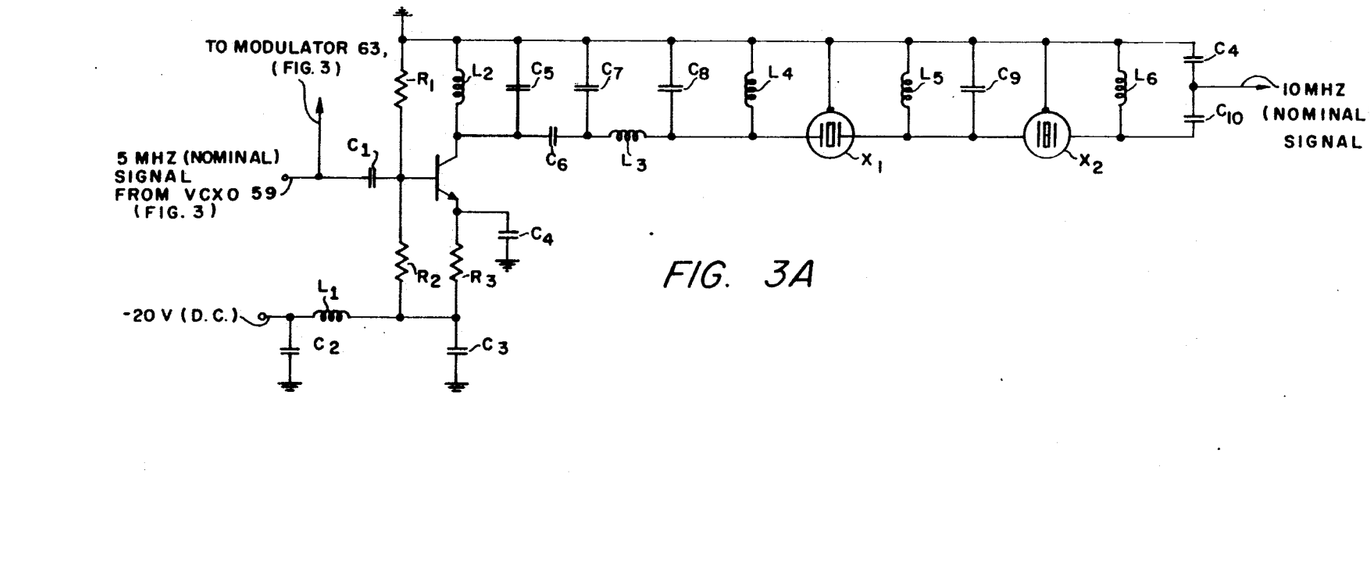
FIG. 3A is a schematic drawing of an exemplary multiplier section in the frequency multiplier shown in FIG. 3.

Referring now to FIGS. 3 and 3A, the details of the multiplier 61 may be seen. Thus, in FIG. 3 the output of the VCXO 59 (FIG. 2) is fed to an amplifier operated as a Class C amplifier (Class C amplifier 101) and to a mixer (modulator 63). The output of the Class C amplifier 101 is fed, through a matching section 105, and a bandpass filter 107, to a crystal filter 109, the signal out of the crystal filter 109 is passed, through a matching section 111, to: (a) a 90° phase shifter 113 (and thence to the phase detector 39Q (FIG. 2)); (b) the phase detector 39I (FIG. 2); and (c) a Class C amplifier (Class C amplifier 115) which is the input stage of another multiplier arrangement.

In a preferred embodiment of the invention, the following obtains: (a) the nominal frequency of the VCXO 59 (FIG. 2) is 5 MHz; (b) the maximum change in frequency of such oscillator is 37 Hz (to correspond with a maximum change of 74 KHz in the frequency of the reference signal applied to the mixers 29a, 29b (FIG. 2)); and (c) the nominal center frequency of the I.F. amplifier and narrow band filters 33a, 33b (FIG. 2) is 10 MHz. The elements making up the portion of the multiplier 61 illustrated in FIG. 3A to meet the foregoing are listed below:

1. Class C Amplifier 101
   $R_1 = 3,300$ ohms
   $C_1 = 1,000$ picofarads
   $R_2 = 1,100$ ohms
   $C_2 = 0.1$ microfarads
   $R_3 = 910$ ohms
   $C_3 = 0.1$ microfarads
   $C_4 = 0.1$ microfarads
   $L_1 = 33$ microhenries
   $L_2 = 6.8$ microhenries
   $Q_1$, type 2N918 transistor.
2. Matching Section 105
   $C_5 = 39$ picofarads
   $C_6 = 25$ picofarads
   $C_7 = 5$ picofarads. 3. Bandpass Filter 107
   $L_3 = 6.8$ microhenries
   $C_8 = 22$ picofarads.
4. Crystal Filter 109
   $L_4, L_5, L_6$ (each) = 47 microhenries
   $C_9 = 47$ picofarads
   $X_1$: Quartz Crystal
   $X_2$: Quartz Crystal.
5. Matching Section 111
   $C_{10} = 6.8$ picofarads
   $C_{11} = 33$ picofarads.

The just described arrangement, then, constitutes a multiplier section having a multiplication factor of 2. That is to say, only the second harmonic of the output of the VCXO 59 (FIG. 2) applied to the Class C amplifier 101 appears at the output of the matching section 111. To put it another way, the just described arrangement may be considered to be a harmonic generator (the Class C amplifier 101) whose output signal is passed through a filter arrangement (the pass band limiting component of which is the crystal filter 109) which has a center frequency of 10 MHz and a bandwidth of 200 Hz. The overall gain of the multiplier section being discussed is unity; that is to say the gain of the Class C amplifier 101 counterbalances the attenuation of the filter arrangement. In this connection it will be noted that even the maximum change in the frequency of the VCXO 59 (FIG. 2) does not result in the second harmonic of the input signal to the Class C amplifier 101 being outside the pass band of the crystal filter 109. Further, it will be noted that the frequency of the "I" and "Q" reference signals applied to the phase detectors 39I, 39Q (FIG. 2) similarly lie within the pass band (10 MHz ± 1 KHz) of the I.F. amplifier and narrow band filter 33 (FIG. 2). It follows then that, even though the frequency of the VCXO 59 (FIG. 2) may drift in a long term prior to launch of the missile 10 (FIG. 1) or may be changed intentionally in accordance with the actual frequency of the radar 12 (FIG. 1) and the Doppler shift experienced during any intercept, the requisite correspondence in frequency between the signals into the phase detectors 39I, 39Q (FIG. 2) may be attained and kept.

The second harmonic of the signal of the VCXO 59 (FIG. 2) (which signal is now to be referred to as the 10 MHz signal), upon passing through the Class C amplifier 115 is changed to a signal having many harmonics. The matching section 117, band pass filter 119, crystal filter 121 and matching section 123 here select the fifth harmonic of the signal out of the Class C amplifier 115 to produce the signal marked 50 MHz. Obviously, although the architecture of the just-mentioned 50 MHz signal selection circuitry is the same as the architecture of the circuitry described above to derive the 10 MHz signal, the values of the various elements are changed to provide a bandpass filter (1 KHz wide) at 50 MHz. Similarly, additional multiplier sections 125, 127, 129 (acting, respectively, as X2, X2 and X5 multipliers) successively operate to produce a 1,000 MHz input signal for the modulator 63.

It will be observed here that, in the ideal case, the bandwidths of multiplier sections 125, 127, 128 should be, respectively, 2 KHz, 4 KHz and 20 KHz. If, however, noise is to be reduced to a practical minimum, the bandwidth of any (or all) of the multiplier sections 125, 127, 129 may be reduced. For example, in a multiplier actually made having the illustrated architecture, the bandwidth of the multiplier section 127 was reduced to 2 KHz. While the effects of such a reduction were to reduce the range through which the frequency of the VCXO 59 (FIG. 2) may be changed (at the price of reducing the range through which the local oscillator signal at X-band may be tuned) to accommodate for the Doppler shift in echo signals), the reduction in noise is more than worth the price. The reduction in noise achieved utilizing this technique is illustrated in FIG. 4.

It will now be noted that the particular multiplier arrangement just described is not the only arrangement for providing a common crystal control for the I and Q reference signals and the local oscillator signal in an inverse monopulse receiver. Thus, the 5 MHz crystal in the VCXO 59 (FIG. 2) (which has a frequency stability in the order of 3.8 parts per million over a five year period under extremes of temperature) may be replaced by a crystal having a higher frequency. For example, for illustrative purposes, assume that a 40 MHz crystal (which, after stabilization, has about the same frequency stability of 3 pp.m. as the 5 MHz crystal actually used) is substituted for such 5 MHz crystal. In such a case, the output of the voltage controlled crystal oscillator would be: (a) divided down by a factor of 4 and filtered to derive the I and Q reference signals at 10 MHz; (b) divided down further by a factor of 2 to derive the 5.n MHz frequencies for the comb of frequencies; and multiplied up by a factor of 250 (rather than by a factor of 2,000 as with the signal from a 5 MHz crystal) to obtain the X-band local oscillator signal. With such an arrangement, the long term drifts of the I and Q reference signals and the X-band local oscillator signal would be substantially the same as those suffered with a 5 MHz crystal. Obviously, however, because the frequency of a 40 MHz crystal would be multiplied by a factor of 250 to obtain the local oscillator signal at X-band (rather than the factor of 2,000 required with a 5 MHz crystal) any frequency changing signal desired to track on feedthrough or echo signals must be increased to obtain the same range of frequencies at X-band.

Referring now to FIG. 2A the details of the processor and autopilot section 20 will be explained. As mentioned hereinbefore, at launch and shortly thereafter the processor and autopilot section 20, operating on feedthrough signals from radar 12, derives a first control signal to set the frequency of the local oscillator in the missile 10 to a desired offset frequency with respect to the frequency of radar 12. Then, when the distance between the missile 10 and the radar 12 is great enough to make feedthrough signals ineffective, a second control signal is derived from echo signals from the target 14 to change the offset frequency of the local oscillator to provide for any Doppler shift due to the relative motion between the missile 10 and the target 14. When the missile 10 receives wide band jamming signals a third control signal (HOJ) is derived. In the HOJ mode the bandwidth of the narrow band phase lock loop is increased so that it locks onto the output of the wide band filter 52.

The processor and autopilot section 20 receives the computed target velocity ($V_T$), the frequency select signal, a launch initiate signal, and the initial antenna pointing position ($A_P$) during the launch sequence via an umbilical cable (not shown). The frequency select signal is converted to an analog signal in D/A converter 241 and is then sent via summing amplifier 75 (FIG. 2) to set the initial frequency of VCO 69. The launch initiate signal, referred to hereinafter as the launch signal, activates timer 201. Timer 201 for a period of L+T1 seconds, which is here approximately one second, supplies a control signal to summing amplifier 203.

Summing amplifier 203 is here the equivalent of an OR gate. Thus, either the signal input from timer 201 or from inverter 205 on the input of summing amplifier 203 is sufficient to provide an output signal which will trigger sweep generator 207. The input signal to inverter 205 is received from phase detector 391 (FIG. 2). As explained hereinbefore, the output of phase detector 391 is a maximum when the narrow band phase lock loop is locked to either a feedthrough signal from radar 12 or an echo signal from target 14. Thus, the absence of a "lock" signal from phase detector 391 will provide a logical high signal on the output of inverter 205.

The output of sweep generator 207 is applied through summing amplifier 209 to provide an "acquire feedthrough" signal which is applied to summing amplifier 53 (FIG. 2). The "acquire feedthrough" signal causes the VCXO 59 to be swept over a band of frequencies until the narrow band phase lock loop locks to a feedthrough signal from radar 12. When a feedthrough signal of sufficient magnitude is present in the searched band an "S-curve" output from discriminator 43 (FIG. 2) will be obtained on every sweep period. The output of discriminator 43 is differentiated by high pass filter 44 to yield a pulse whose peak corresponds to the center of the "S-curve" from discriminator 43. The amplitude of this pulse is compared to a preset threshold (CFAR REF.) in differential amplifier 211. If the preset threshold is exceeded the output of differential amplifier 211 is passed through gated amplifier 213 to provide a "stop sweep" signal to sweep generator 207. The output from gated amplifier 213 is also applied to S/H 215 to enable that element to accept the output from sweep generator 207. When this nonsweeping signal from S/H 215 is applied through summing amplifiers 209 and 53 (FIG. 2) and then to VCXO 59, the narrow band phase lock loop is able to sychronize and track on this signal.

At some time later in the flight, here at L+T2 seconds, which is approximately 1.5 seconds, when the distance between the missile 10 and the radar 12 is great enough to make feedthrough signals ineffective, a second control signal is applied to the VCXO 59 to condition the missile 10 to accept echo signals from a target 14. The missile local oscillator is then swept about this expected range of target frequencies until the narrow band phase lock loop is locked to the target at which time the receiver is switched into a multiplex mode.

At time L+T2 seconds timer 201 supplies a second control signal to a gated amplifier 217 which allows a signal ($V_T$), representative of the predicted target frequency, to be passed to a summing amplifier 219 which develops an "acquire target" signal which in turn is sent to summing amplifier 55 (FIG. 2) to offset the frequency of the VCXO 59. Said second control signal from timer 201 is also applied to gated amplifiers 221, 223. Gated amplifier 221, when gated ON by said second control signal from timer 201, will allow the output from inverter 205 (which is a logical high signal in the absence of phase lock) to provide a trigger signal to narrow band sweep generator 225. The output from narrow band sweep generator 225 is applied through summing amplifier 227 to summing amplifier 219. This sweep signal from summing amplifier 219 causes the VCXO 59 (FIG. 2) to be swept over a narrow range centered at the predicted target frequency. When echo signals of sufficient magnitude from target 14 are swept into the searched band an output pulse is obtained from the combination of discriminator 43 and high pass filter 44 as explained hereinabove. Said output pulse is compared to a preset threshold in differential amplifier 211 and if it is of sufficient magnitude it is passed through gated amplifier 223 to provide a "stop sweep" signal to narrow band sweep generator 225. The output of gated amplifier 223 is also applied to S/H 229 to enable that element to accept the output from narrow band sweep generator 225. When this nonsweeping signal from S/H 229 is applied through summing amplifiers 227, 219, 55, 57 to VCXO 59 the narrow band phase lock loop is able to synchronize and track on this signal. The output of gated amplifier 223 is also applied to summing amplifier 231. Summing amplifier 231 is here the equivalent of an OR gate and is effective with an input signal from either gated amplifier 223 or gated amplifier 233 to trigger the time multiplex switch controller 235.

The time multiplex switch controller 235 provides the control signals for switches 35a, 35b, 41a and 41b (FIG. 2). On one-half of the time multiplexing cycle the output from the phase detectors 39Q, 39I (FIG. 2) are respectively fed into the narrow band phase lock loop and the processor section 20. During the other half of the time multiplexing cycle the pitch (p$_c$) and yaw (y$_c$) signals are sampled into the autopilot processor 239.

If the missile 10 receives wideband jamming signals a third control signal (HOJ) is derived in the following manner. A wideband jamming signal will result in a large output from the AGC detector and amplifier 37a (FIG. 2). Said output from the AGC detector and amplifier 37a is compared to a preset threshold (HOJ REF.) in differential amplifier 236 (FIG. 2A), and if said output exceeds the preset threshold, differential amplifier 236 will turn ON gated amplifier 233. The second input to gated amplifier 233 is the output from inverter 205 which in turn is the output from phase detector 39I (FIG. 2). Under the presence of wideband jamming signals the narrow band phase lock loop will not be able to lock and, therefore, the output from inverter 205 will be a logical high signal which will be passed by gated amplifier 233 to trigger the switch controller 237 which derives the HOJ control signal. In the HOJ node switch 49 (FIG. 2) is activated and the bandwidth of the narrow band phase lock loop is increased so that it locks onto the output of the wideband filter 52.

Before proceeding further, it will be observed that the initial frequency of VCO 69 (FIG. 2) was set in response to a control signal received via the umbilical cable (not shown). If during the intercept engagement it is deemed advantageous to change the frequency of radar 12, the VCO 69 may be changed a corresponding amount by the circuitry to be described. Thus, the second control signal from timer 201 occurring at L+T2 seconds is used to trigger a second timer 243. Timer 243 is used to strobe storage unit 245 in which predetermined values of operating frequency are stored. Said predetermined frequency values are converted to appropriate analog voltages by D/A converter 241 which is synchronized by clock pulses from the VCXO 59 (FIG. 2). The "frequency select" signal is applied to VCO 69 via summing amplifier 75. It should be noted that if such frequency agility is desired, the radar 12 would be equipped with circuitry similar to that just described.

Having described an embodiment of this invention, it will now be apparent to one of skill in the art that many changes may be made without departing from our inventive concepts. It is felt, therefore, that the invention should not be restricted to its disclosed embodiment, but rather should be limited only by the spirit and scope of the appended claims.

What is claimed is:

1. For use in a radar receiver for a guidance system on board a missile, such receiver including an intermediate frequency amplifier and a phase detector for demodulating signals out of such amplifier, an improved local oscillator arrangement comprising:
    (a) a voltage controlled crystal oscillator for producing an output signal;
    (b) frequency control means, responsive to the demodulated signals out of the phase detector, for changing the frequency of the output signal of the voltage controlled crystal oscillator;
    (c) frequency conversion means, responsive to the output signal of the voltage controlled crystal oscillator, for converting such signal into a comb of signals around a harmonic of the output signal of the voltage controlled crystal oscillator;
    (d) means for selecting one signal in the comb of signals; and
    (e) means, responsive to the selected signal, for generating the local oscillator signal for the intermediate frequency amplifier.

2. The improved local oscillator arrangement of claim 1 wherein the frequency conversion means comprises:
    (a) a plurality of similar frequency multiplier sections, each successive one of such sections being arranged to produce a successively higher harmonic of the output signal of the voltage controlled crystal oscillator; and
    (b) a mixer, responsive to the output signal from the last one of the plurality of similar frequency multiplier sections and to the output signal of the voltage controlled oscillator, for producing a comb of signals.

3. The improved local oscillator arrangement as in claim 2 wherein each one of the plurality of multiplier sections includes:
    (a) a Class C amplifier, responsive to a sinusoidal input signal, to produce a plurality of harmonics of such signal;
    (b) a crystal filter having a pass band encompassing a selected one of the harmonics of the input signal.

4. The improved local oscillator arrangement as in claim 3 wherein a first one of said crystal filters has a bandwidth of 200 Hz.

* * * * *